(12) United States Patent
Oh

(10) Patent No.: US 10,720,466 B2
(45) Date of Patent: Jul. 21, 2020

(54) IMAGE SENSOR HAVING PD BIAS PATTERNS

(71) Applicant: SK hynix Inc., Icheon-si (KR)

(72) Inventor: Sun-Ho Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 34 days.

(21) Appl. No.: 16/218,819

(22) Filed: Dec. 13, 2018

(65) Prior Publication Data

US 2019/0296075 A1    Sep. 26, 2019

(51) Int. Cl.

| | | |
|---|---|---|
| *H01L 27/14* | (2006.01) | |
| *H01L 27/146* | (2006.01) | |
| *H04N 5/376* | (2011.01) | |
| *H04N 5/378* | (2011.01) | |
| *H04N 5/3745* | (2011.01) | |

(52) U.S. Cl.
CPC .. *H01L 27/14643* (2013.01); *H01L 27/14607* (2013.01); *H01L 27/14614* (2013.01); *H01L 27/14621* (2013.01); *H04N 5/378* (2013.01); *H04N 5/3765* (2013.01); *H04N 5/37455* (2013.01)

(58) Field of Classification Search
CPC ..... H01L 27/14; H01L 27/146; H01L 27/146; H01L 27/14607; H01L 27/1464; H01L 27/14643; H01L 27/14611; H01L 27/14614; H01L 27/1462; H01L 27/14621
USPC ........................................................ 257/292
See application file for complete search history.

(56) References Cited

U.S. PATENT DOCUMENTS

| | | | |
|---|---|---|---|
| 8,426,238 B2 | 4/2013 | Nishizawa et al. | |
| 8,785,993 B2 | 7/2014 | Abe | |
| 8,922,686 B2 * | 12/2014 | Mizumura | ........ H01L 27/14603 257/292 |
| 9,591,244 B2 | 3/2017 | Tanaka | |

* cited by examiner

*Primary Examiner* — Monica D Harrison
(74) *Attorney, Agent, or Firm* — Perkins Coie LLP

(57) ABSTRACT

An image sensor is disclosed. The image sensor may include a photosensing region in a substrate and configured to generate photoelectrons in response to incident light on the photosensing region; bias patterns arranged to surround the photosensing region and including a conductive material; a floating diffusion region at a center of the photosensing region to store photoelectrons generated by the photosensing region; and transfer gates that partially overlap with the floating diffusion region and are operable to transfer photoelectrons generated by the photosensing region to the floating diffusion region. The photosensing region and the bias patterns are electrically isolated from one another.

19 Claims, 15 Drawing Sheets

IMAGE SENSOR HAVING PD BIAS PATTERNS

CROSS-REFERENCE TO RELATED APPLICATIONS

This patent document claims priority of Korean Patent Application No. 10-2018-0032550, filed on Mar. 21, 2018, which is incorporated herein by reference in its entirety.

TECHNICAL FIELD

The technology and implementations disclosed in this patent document generally relate to an image sensor having photodiode (PD) bias patterns, and to an electronic device including the image sensor.

BACKGROUND

Due to recent advancement of information communication industry and digitalization of electronic devices, image sensors with improved performance are being used in various fields such as digital cameras, camcorders, mobile phones, Personal Communication Systems (PCS), game machines, security cameras, and medical micro cameras. Generally, an image sensor includes a pixel area including a photodiode and a peripheral circuit area. A unit pixel includes a photodiode and a transfer transistor. As the resolution of the image sensors increases and the size of unit pixels becomes smaller, there has been a need to reduce the physical volume of the photodiode. Accordingly, the capability for generating photoelectron in the photodiode becomes important.

SUMMARY

This patent document provides, among others, designs of image sensors that include photodiode (PD) bias patterns.

Embodiments of the disclosed technology are directed to an image sensor to receive all the lights of four colors through one photodiode.

In an embodiment of the disclosed technology, an image sensor may include a photosensing region in a substrate and configured to generate photoelectrons in response to incident light on the photosensing region; bias patterns arranged to surround the photosensing region and including a conductive material; a floating diffusion region at a center of the photosensing region to store photoelectrons generated by the photosensing region; and transfer gates that partially overlap with the floating diffusion region and are operable to transfer photoelectrons generated by the photosensing region to the floating diffusion region. The photosensing region and the bias patterns may be electrically isolated from one another.

In another embodiment of the disclosed technology, an image sensor may include a substrate; first to fourth PD bias patterns disposed in the substrate and including a conductive material and providing a photodiode region in the substrate; a floating diffusion region disposed in an upper portion of the substrate and around a center of the photodiode region; and first to fourth transfer gates disposed over the substrate to overlap with the photodiode region and the floating diffusion region to cause transfer of photoelectrons generated in the photodiode region to the floating diffusion region. The first to fourth PD bias patterns may be radially arrayed on first to fourth quadrants of the photodiode region and spaced apart from one another.

In another embodiment of the disclosed technology, an image sensor may include a photodiode region in a substrate; conductive first to fourth photodiode (PD) bias patterns that surround the photodiode region; a floating diffusion region at a center of the photodiode region; and first to fourth transfer gates that partially overlap with the floating diffusion region. The photodiode region and the first to fourth PD bias patterns may be electrically isolated from each other.

In another embodiment of the disclosed technology, an image sensor may include conductive first to fourth photodiode (PD) bias patterns suitable for defining one photodiode region in a substrate; a floating diffusion region disposed at a center of the photodiode region; and first to fourth transfer gates that overlap with the photodiode region and the floating diffusion region. The first to fourth PD bias patterns may be arrayed radially over first to fourth quadrants to be spaced apart from each other.

DETAILED DESCRIPTION

Figure 1:
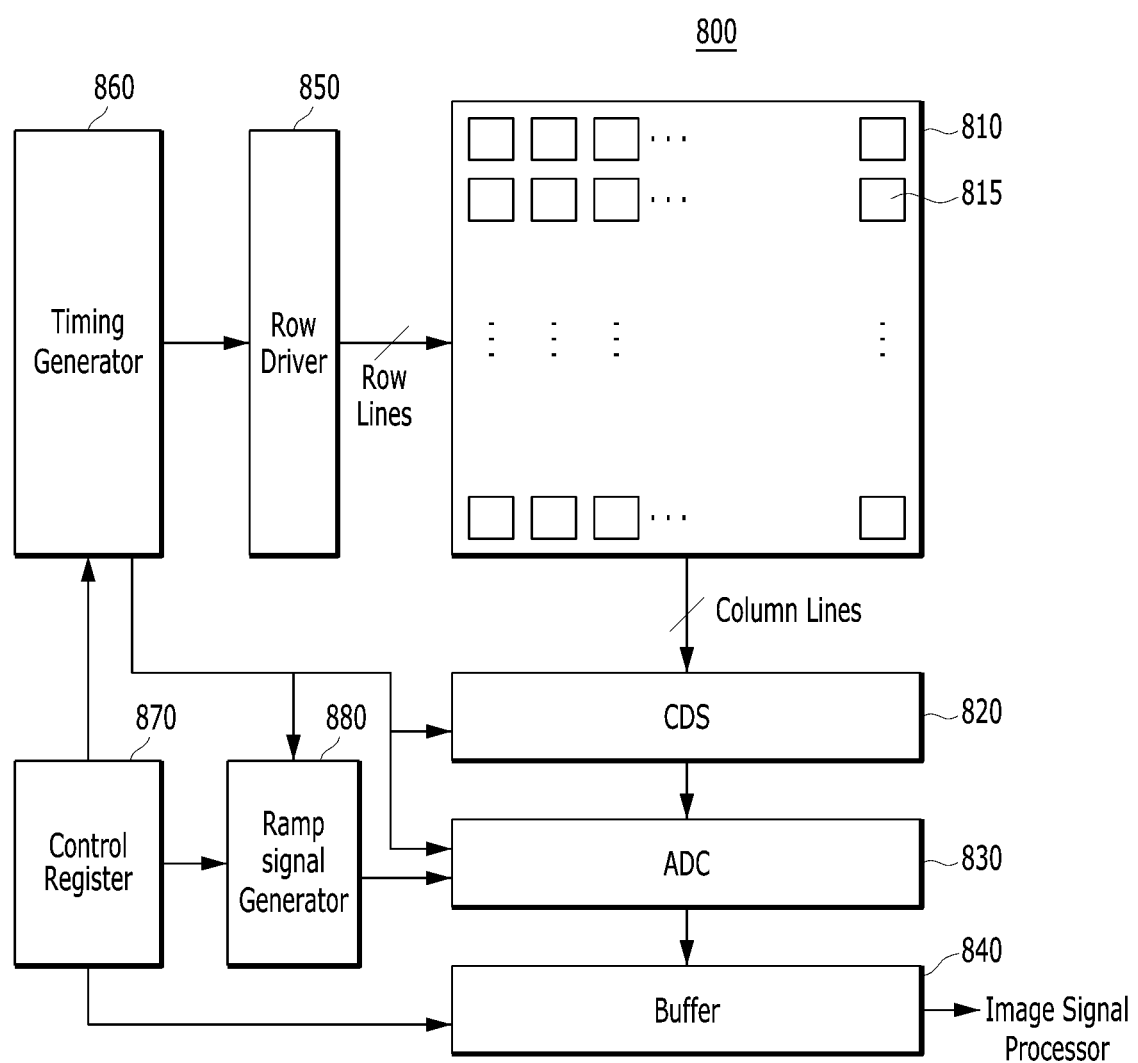
FIG. 1 is a block diagram illustrating an exemplary image sensor in accordance with an embodiment of the disclosed technology.

The disclosed technology can be implemented to provide an image sensor designed to receive multiple colored lights using a single photodiode. For example, some implementations of the disclosed technology provide an image sensor having bias patterns including conductive materials and receiving different voltages during the operation of the image sensor. By applying different voltages to the bias patterns, the image sensor can have effective photodiode regions that can generate photoelectrons having different color information.

In the present disclosure, advantages, features and methods for achieving them will become more apparent after a reading of the following exemplary embodiments taken in conjunction with the drawings. Throughout the disclosure, like reference numerals refer to like parts throughout the various figures and embodiments of the present invention.

As used herein, a singular form is intended to include plural forms as well, unless the context clearly indicates otherwise. It will be further understood that the terms "include" and/or "including," when used in this specification, specify the presence of at least one stated feature, step, operation, and/or element, but do not preclude the presence or addition of one or more other features, steps, operations, and/or elements thereof.

FIG. 1 is a block diagram schematically illustrating an image sensor 800 based on an embodiment of the disclosed technology. Referring to FIG. 1, the image sensor 800 may include a pixel array 810 in which a plurality of pixels is arranged in a matrix structure. e.g., an array of pixels arranged in rows and columns, a correlated double sampler (CDS) 820, an analog-digital converter (ADC) 830, a buffer 840, a row driver 850, a timing generator 860, a control register 870, and a ramp signal generator 880.

The pixel array 810 may include a plurality of pixel blocks 815 which are arranged in a matrix structure including columns and rows. In response to a reception of an incident light, each of the plurality of pixel blocks 815 may convert an optical image information on the received incident light into an electrical image signal, and transmit the electrical image signal to the correlated double sampler 820 through a column line. Each of the plurality of pixel blocks 815 may be coupled with one of row lines and one of column lines. A color filter may be arranged on each of pixel blocks in the pixel array 810 such that light of a specific color is selected to each pixel. For example, each of the plurality of pixel blocks 815 may include three different color patterns such that a red color pattern, a green color pattern and a blue color pattern are arranged in the form of a matrix including rows and columns. One example way of arranging the colors of the color filters is the well-known Bayer color filter pattern of a repetitive Bayer color filter unit patterns with each unit pattern having 2 green color filter pixels, 1 blue color filter pixel, and 1 red color filter pixel.

The correlated double sampler 820 may hold and sample the electrical image signals which are received from the pixel blocks 815 of the pixel array 810. For example, the correlated double sampler 820 may sample a reference voltage level and the voltage level of a received electrical image signal according to a clock signal provided from the timing generator 860, and transmit an analog signal corresponding to the difference therebetween to the analog-digital converter 830.

The analog-digital converter 830 may convert the received analog signal into a digital signal, and transmit the digital signal to the buffer 840.

The buffer 840 may store or latch the received digital signal and successively output the latched digital signal to an external image signal processor. The buffer 840 may include a memory to temporarily store or latch a digital signal and a sense amplifier for amplifying the digital signal.

The row driver 850 may drive the plurality of pixel blocks 815 of the pixel array 810 according to a signal of the timing generator 860. For example, the row driver 850 may generate select signals each for selecting one of the plurality of row lines and/or driving signals each for driving one of the plurality of row lines.

The timing generator 860 may generate a timing signal for controlling the correlated double sampler 820, the analog-digital converter 830, the row driver 850 and the ramp signal generator 880.

The control register 870 may generate control signals for controlling the buffer 840, the timing generator 860 and the ramp signal generator 880.

The ramp signal generator 880 may generate a ramp signal for controlling an image signal outputted from the buffer 840, according to control of the timing generator 860.

Each pixel block 815 of the image sensor 800 can include a photosensor or photosensing element that converts received light into electrical charges, which may be implemented in a suitable configuration, including a photodiode, a photogate, a phototransistor, a photoconductor, or some other photosensitive structure capable of generating photo-generated electrical charges. Each imaging pixel can also include a charge storage region for storing the photo-generated charges, which may be constructed as, for example, a floating diffusion region as disclosed in the examples below. Additional circuitry may be included in each imaging pixel, e.g., a transfer transistor for transferring the photo-generated charges from the photosensor or the photosensing element to the storage region and a reset circuitry for resetting the charges in the charge storage region after a readout.

Figure 2:
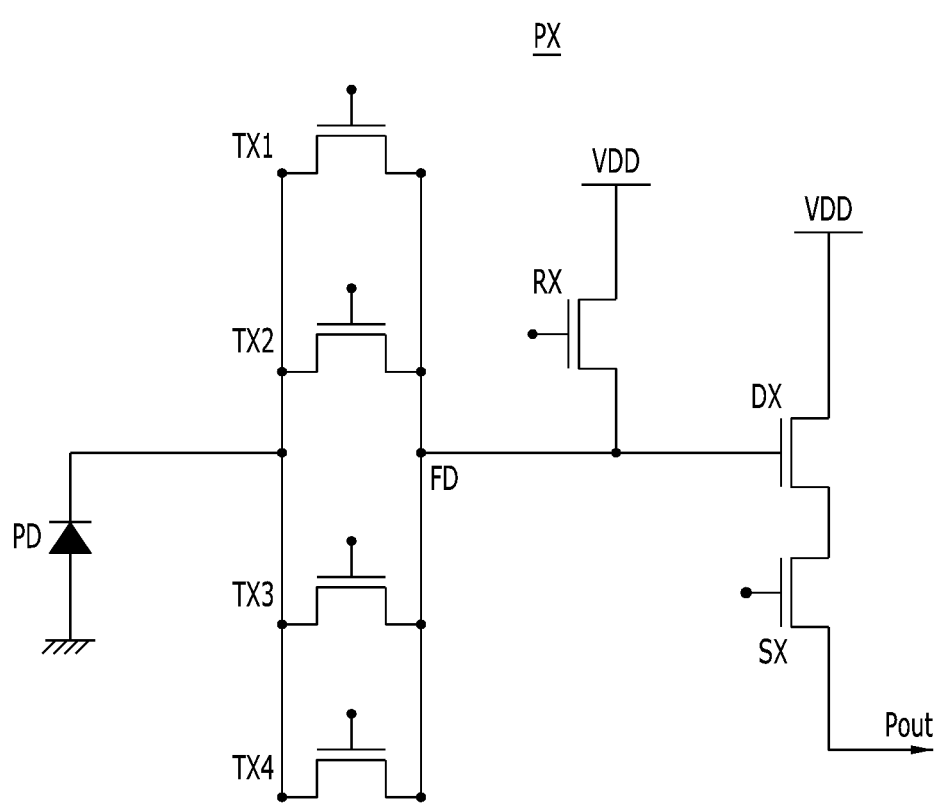
FIG. 2 is an equivalent circuit diagram of an exemplary unit pixel of an image sensor in accordance with an embodiment of the disclosed technology.

FIG. 2 is an equivalent circuit diagram of a unit pixel of an image sensor in accordance with an embodiment of the disclosed technology. Referring to FIG. 2, a unit pixel PX of an image sensor in accordance with the embodiment of the disclosed technology may include a photodiode PD, first to fourth transfer transistors TX1 to TX4, a floating diffusion region FD, a reset transistor RX, a drive transistor DX, a selection transistor SX, and an output port Pout.

In response to an incident light received thereon, the photodiode PD may receive light and generate electron-hole pairs. The first to fourth transfer transistors TX1 to TX4 can transfer electrons generated in the photodiode PD to the floating diffusion region FD. The first to fourth transfer transistors TX1 to TX4 may be coupled in parallel, and may be turned on or off independently. For example, when one among the first to fourth transfer transistors TX1 to TX4 is turned on and in a turned-on state, other three transfer transistors may be turned off and in a turn-off state.

The floating diffusion region FD may be coupled to a gate electrode of the drive transistor DX. The electrons in the floating diffusion region FD may turn on the drive transistor DX. An electrical signal passing through the drive transistor DX may be outputted to the output port Pout through the selection transistor SX.

The reset transistor RX may reset the floating diffusion region FD to a power source voltage VDD level. After the electric signal is outputted to the output port Pout, the floating diffusion FD may be reset to the initial voltage level, for example, the power source voltage VDD by the reset transistor RX.

The image sensor in accordance with the embodiment of the disclosed technology may include the first to fourth transfer transistors TX1 to TX4 coupled in parallel with respect to one another. The first to fourth transfer transistors TX1 to TX4 may share the same photodiode PD.

Figure 3A:
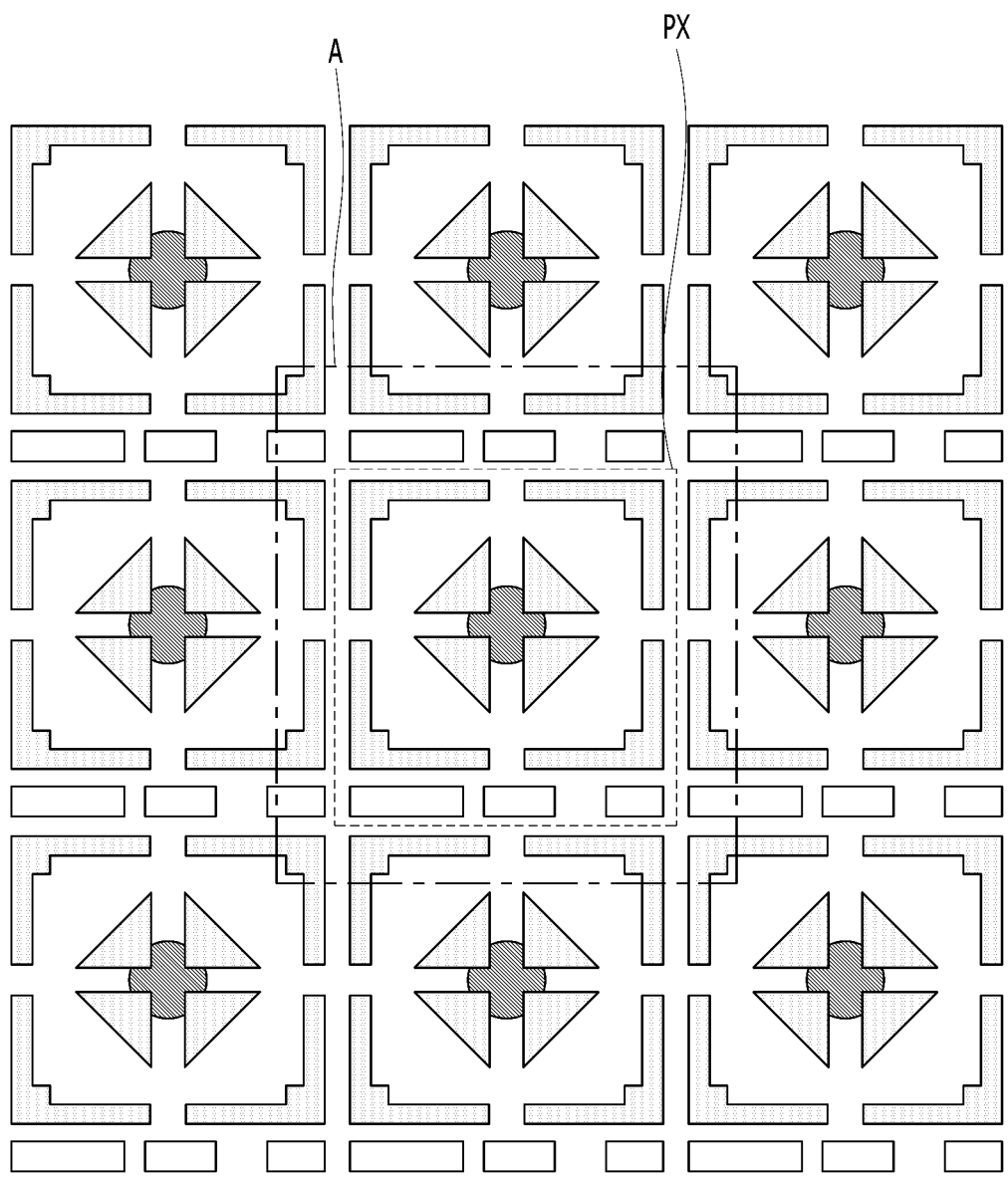
FIG. 3A is a schematic layout of an exemplary pixel array of an image sensor including a plurality of unit pixels in accordance with the embodiment of the disclosed technology.
Figure 3B:
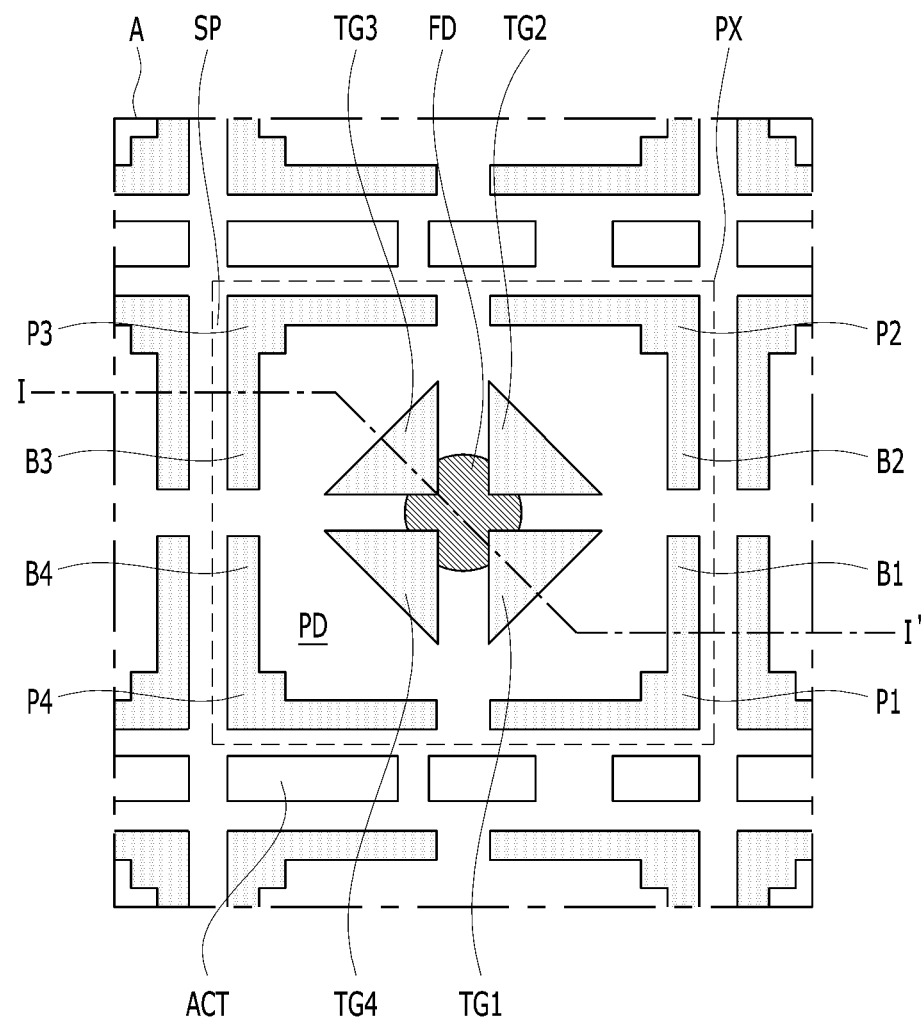
FIG. 3B is a magnified layout of an exemplary unit pixel of an image sensor in accordance with the embodiment of the disclosed technology.

FIG. 3A is a schematic layout of a pixel array of an image sensor including a plurality of unit pixels in accordance with an embodiment of the disclosed technology. FIG. 3B is a magnified layout of the area A of the image sensor shown in FIG. 3A. Referring to FIG. 3A, the pixel array of the image sensor according to an exemplary embodiment of the disclosed technology may include a plurality of unit pixels PX arranged in a matrix shape, e.g., an array of pixel units PXs arranged in rows and columns.

Referring to FIG. 3B, each of the unit pixels PX that is spaced apart from one another by a space region SP may include a photodiode region PD, first to fourth PD (photodiode) bias patterns B1 to B4, a floating diffusion region FD, first to fourth transfer gates TG1 to TG4, and active regions ACT.

Each of the first to fourth PD bias patterns B1 to B4 may have a shape such as an elbow shape or an 'L' letter shape in a top view. For example, each of the first to fourth PD bias pattern B1 to B4 has a shape having portions extending two different directions and a connecting portion between the extending portions. The first to fourth PD bias patterns B1 to B4 may be arranged on four different sides of the photodiode region PD. The first to fourth PD bias patterns B1 to B4 may surround the photodiode region PD to form a rectangular shape. In some implementations, the first to fourth PD bias patterns B1 to B4 may be disposed in the periphery of the photodiode region PD. The first to fourth PD bias patterns B1 to B4 may be radially disposed to be spaced apart from one another on first to fourth quadrants, respectively. The first to fourth PD bias patterns B1 to B4 may include a conductor. For example, the first to fourth PD bias patterns B1 to B4 may include at least one of doped poly-crystalline silicon, a metal, a metal compound, or a metal alloy, or combinations thereof.

The first to fourth PD bias patterns B1 to B4 may include first to fourth pad regions P1 to P4, respectively. The first to fourth pad regions P1 to P4 may be portions of the first to fourth PD bias patterns B1 to B4, respectively. The first to fourth pad regions P1 to P4 may provide a space for contacting a contact plug for applying an electrical bias to the first to fourth PD bias patterns B1 to B4.

The floating diffusion region FD may be disposed at or around the center of the photodiode region PD. The floating diffusion region FD may be or include an N-type doped region.

The first to fourth transfer gates TG1 to TG4 may be arranged on the first to fourth quadrants of the floating diffusion region FD, respectively. The first to fourth transfer gates TG1 to TG4 may partially surround the floating diffusion region FD together with the first to fourth PD bias patterns B1 to B4. The first to fourth transfer gates TG1 to TG4 may partially overlap with the floating diffusion region FD. The first to fourth transfer gates TG1 to TG4 may be formed of or include doped polycrystalline silicon, a metal, a metal compound, a metal alloy, or the like so as to transfer electrons generated in the photodiode region PD to the floating diffusion region FD.

The active regions ACT may be disposed adjacent to one side of the unit pixel PX to provide source regions, drain regions, and channel regions of a drive transistor, a selection transistor, and a reset transistor.

The photodiode region PD of the unit pixel PX of the image sensor in accordance with the present embodiment may be integrated into one without being divided into four.

Figure 4:
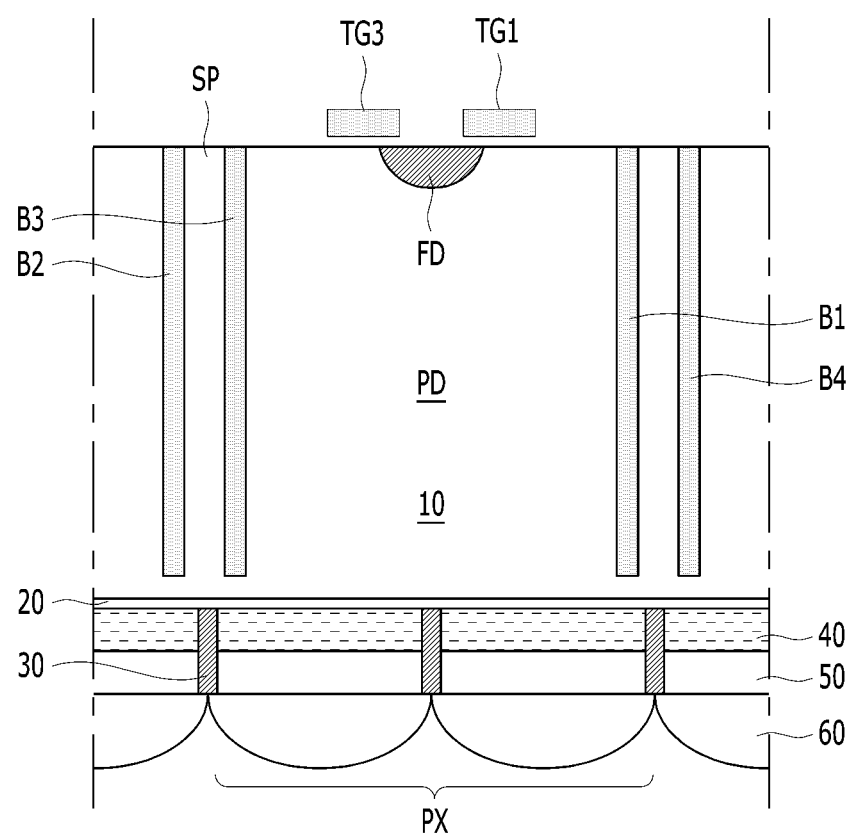
FIG. 4 is a longitudinal cross-sectional view of the unit pixel of the image sensor taken along a line I-I' of FIG. 3B.

FIG. 4 is a longitudinal cross-sectional view of the unit pixel of the image sensor taken along a line I-I' of FIG. 3B. Referring to FIG. 4, the image sensor in accordance with an embodiment of the disclosed technology may include first to fourth PD bias patterns B1 to B4 in the substrate 10, the photodiode region PD, the floating diffusion region FD, the first to fourth transfer gates TG1 to TG4 on an upper side of the substrate 10, an antireflection layer 20 on a lower side of the substrate 10, grid patterns 30, shutter patterns 40, color filters 50, and micro-lenses 60. As indicated in FIG. 4, among the first to fourth PD bias patterns B1 to B4, the first and third PD bias patterns B1 and B3 may be included in the unit pixel PX and the second and fourth PD bias patterns B2 and B4 may be included in adjacent unit pixels.

The first to fourth PD bias patterns B1 to B4 may be formed in the shape of a partition wall filling deep trenches. For example, the first to fourth PD bias patterns B1 to B4 may include a lining insulating layer formed on the inner walls of the deep trenches formed in the inside of the substrate 10, and a conductive plug filling the deep trenches on the lining insulating layer. In some implementations, the conductive plug may fully fill the deep trenches on the lining insulating layer.

The lining insulating layer may include a silicon oxide and/or a silicon nitride. The conductive plug may include at least one of doped poly-crystalline silicon, a metal, a metal compound, or a metal alloy, or combinations thereof. Therefore, the photodiode region PD may be electrically insulated from the first to fourth PD bias patterns B1 to B4.

The first to fourth PD bias patterns B1 to B4 may be formed to extend from the upper side of the substrate 10 into the inside of the substrate 10, and the lower portions of the first to fourth PD bias patterns B1 to B4 may be spaced apart from the lower side of the substrate 10. For example, the substrate 10 may have a thickness greater than that of the first to fourth PD bias patterns B1 to B4. In the drawing, the first and third PD bias patterns B1 and B3 may be included in the same unit pixel PX, and the second and fourth PD bias patterns B2 and B4 may be included in other unit pixels PXs which are disposed adjacent to the unit pixel PX including the first and third PD bias patterns B1 and B3. The space regions SP may be interposed between the neighboring unit pixels PXs.

Referring to the cross-sectional view of FIG. 4, the photodiode region PD may be disposed between first and third PD bias patterns B1 and B3 in the unit pixel PX. In some implementations, the photodiode region PD may be surrounded by the first to fourth PD bias patterns B1 to B4. The floating diffusion region FD may be formed in an upper portion of or around the center of the photodiode region PD. The first and third transfer gates TG1 and TG3 may be disposed on the photodiode region PD so as to partially vertically overlap with a portion of the floating diffusion region FD.

The antireflection layer 20 may include a single layer or multilayer of or including a dielectric inorganic layer, such as at least one of a silicon nitride, a silicon oxide, a silicon oxynitride, aluminum oxide, hafnium oxide, or tantalum oxide, or combinations thereof.

A portion of the grid patterns 30 may be aligned or disposed to vertically overlap with a central portion (e.g., the floating diffusion region FD) of the photodiode region PD. Some portions of the grid patterns 30 may be aligned or disposed to overlap with the pixel isolation patterns 15 in the space regions SP. The grid patterns 30 may include a metal-like conductor. Accordingly, a voltage may be applied to the grid patterns 30.

The shutter patterns 40 and the color filters 50 may be disposed or stacked between the grid patterns 30 along a direction parallel to the substrate 10. The shutter patterns 40 may be turned on or off to selectively transmit light. For example, the shutter patterns 40 may block or transmit light according to the electric field generated by the voltage applied by the grid patterns 50. The shutter patterns 40 may include a light blocking material layer such as a polarizing filter or a liquid crystal display (LCD). Each of the color filters 50 may include a polymeric organic material including one pigment among green, red, or blue.

The color filters 50 may be formed over the shutter patterns 40, respectively. The micro-lenses 60 may be formed over the color filters 50, respectively. The micro-lenses 60 may include a transparent polymer organic material or an inorganic material such as a silicon oxide.

FIGS. 5A to 5D are conceptual top views illustrating operations of an unit pixel in first to fourth operation cycles of an image sensor according to an embodiment of the disclosed technology.

Figure 5A:
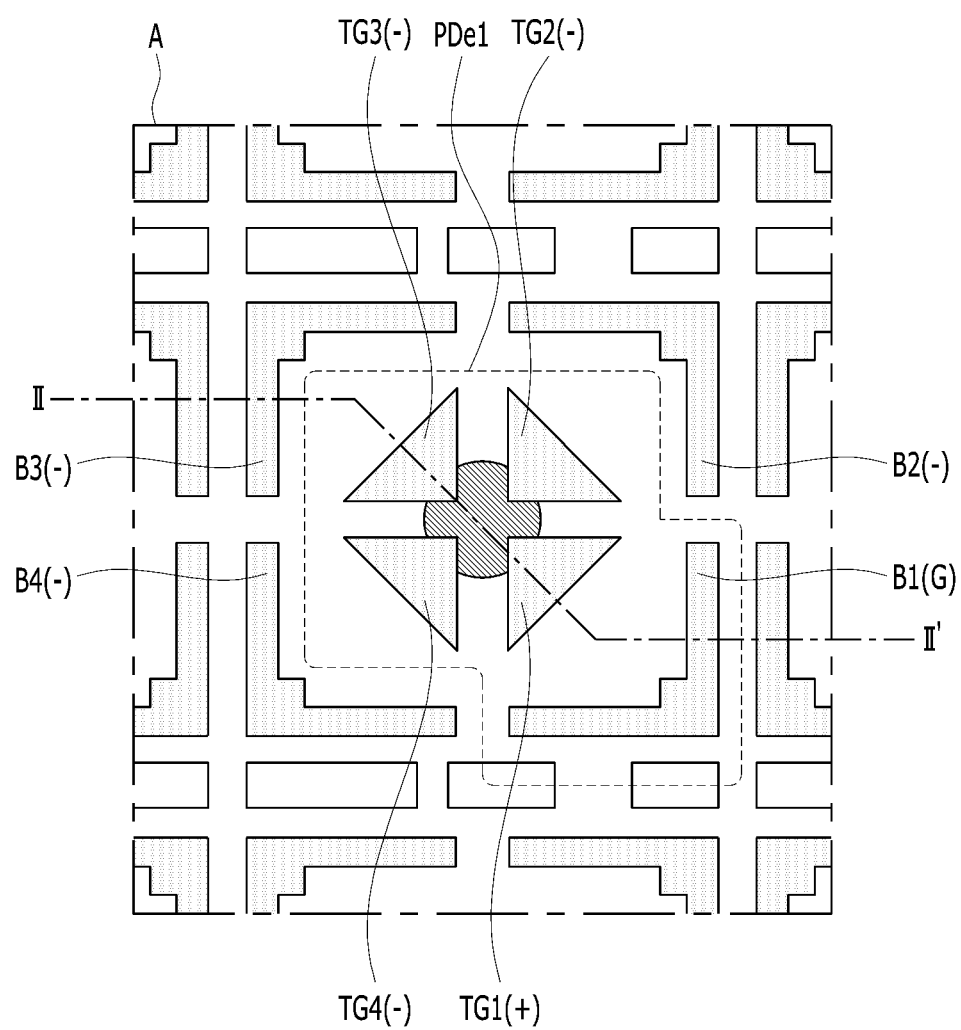
FIGS. 5A to 5D are conceptual top views illustrating exemplary operations of an unit pixel in first to fourth operation cycles of an image sensor according to the embodiment of the disclosed technology.

FIG. 5A is a top view illustrating an operation of the unit pixel PX in a first operation cycle of the image sensor in accordance with the embodiment of the disclosed technology. Referring to FIG. 5A, when the first PD bias pattern B1 of the unit pixel PX is grounded and a negative (−) voltage is applied to the second to fourth PD bias patterns B2 to B4 in the first operation cycle, a first effective photodiode region PDe1 may be defined as shown with the dotted line in the drawing. Specifically, since the second to fourth PD bias patterns B2 to B4 to which the negative (−) voltage is applied may provide a depletion region where there is no electron in the photodiode region PD, the photodiode region PD in which photoelectrons are generated may be reduced around the second to fourth PD bias patterns B2 to B4. The first PD bias pattern B1 which is grounded may enlarge the photodiode region PD in which electrons are generated. In the first operation cycle, the effective photodiode region PDe1 may include the enlarged periphery of the first PD bias pattern B1 and the reduced peripheries of the second to fourth PD bias patterns B2 to B4, as compared to the photodiode region PD shown in FIGS. 3A and 3B. In the first operation cycle, a positive voltage (+) may be applied to the first transfer gate TG1 and a negative voltage (−) may be applied to the second to fourth transfer gates TG2 to TG4. Thus, in the first operation cycle, the first transfer gate TG1 may transfer photoelectrons generated in the first effective photodiode region PDe1 to the floating diffusion region FD.

Figure 5B:
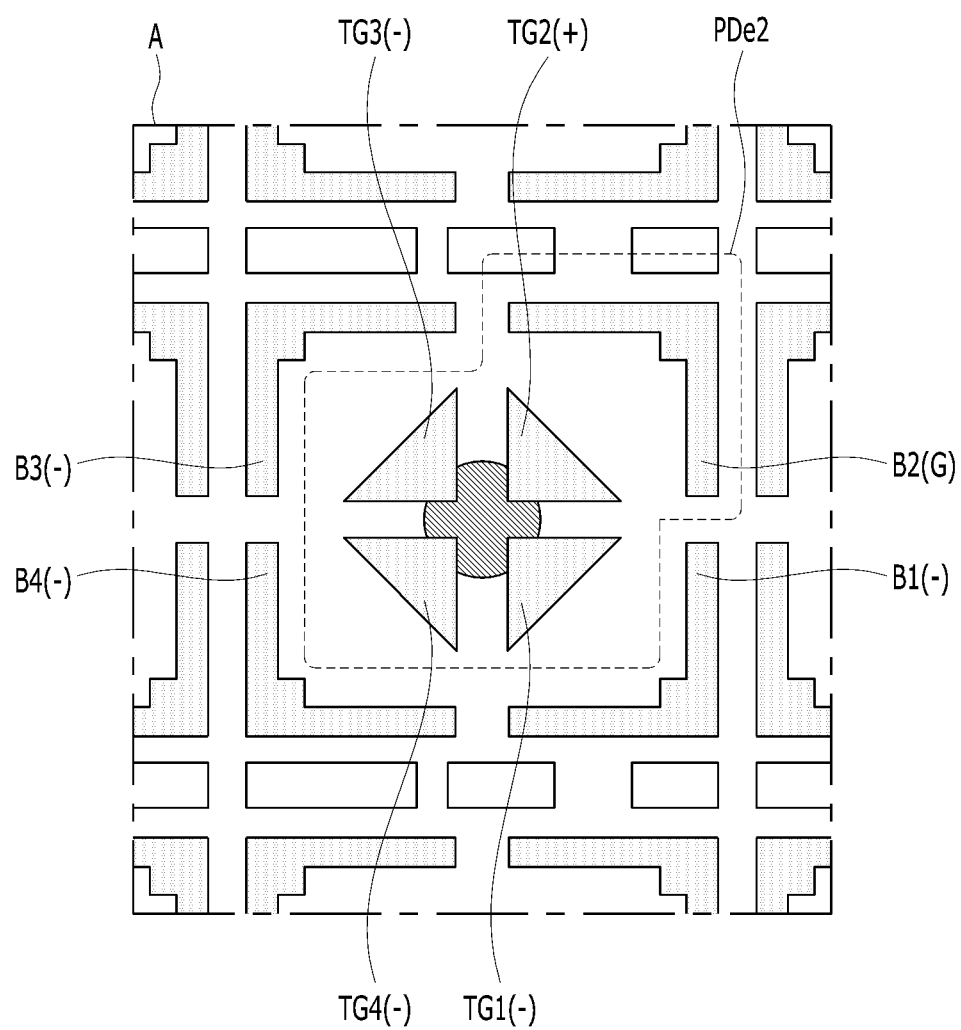

FIG. 5B is a top view illustrating an operation of the unit pixel PX in a second operation cycle of the image sensor in accordance with the embodiment of the disclosed technology. Referring to FIG. 5B, when the second PD bias pattern B2 of the unit pixel PX is grounded (G) and a negative (−) voltage is applied to the first, third, and fourth PD bias patterns B1, B3, and B4 in the second operation cycle, a second effective photodiode region PDe2 may be defined as shown with the dotted line in the drawing. Specifically, since the first, third, and fourth PD bias patterns B1, B3, and B4 to which the negative (−) voltage is applied may provide a depletion region where there is no electron in the photodiode region PD, the photodiode region PD in which photoelectrons are generated may be reduced around the first, third, and fourth PD bias patterns B1, B3, and B4. The second PD bias pattern B2 which is grounded may enlarge the photodiode region PD where electrons are generated. In other words, in the second operation cycle, the effective photodiode region PDe2 may include the enlarged periphery of the second PD bias pattern B2 and the reduced peripheries of the first, third, and fourth PD bias patterns B1, B3 and B4, as compared to the photodiode region PD shown in FIGS. 3A and 3B. In the second operation cycle, a positive (+) voltage may be applied to the second transfer gate TG2, and a negative voltage (−) may be applied to the first, third, and fourth transfer gates TG1, TG3 and TG4. Thus, in the second operation cycle, the second transfer gate TG2 may transfer photoelectrons generated in the second effective photodiode region PDe2 to the floating diffusion region FD.

Figure 5C:
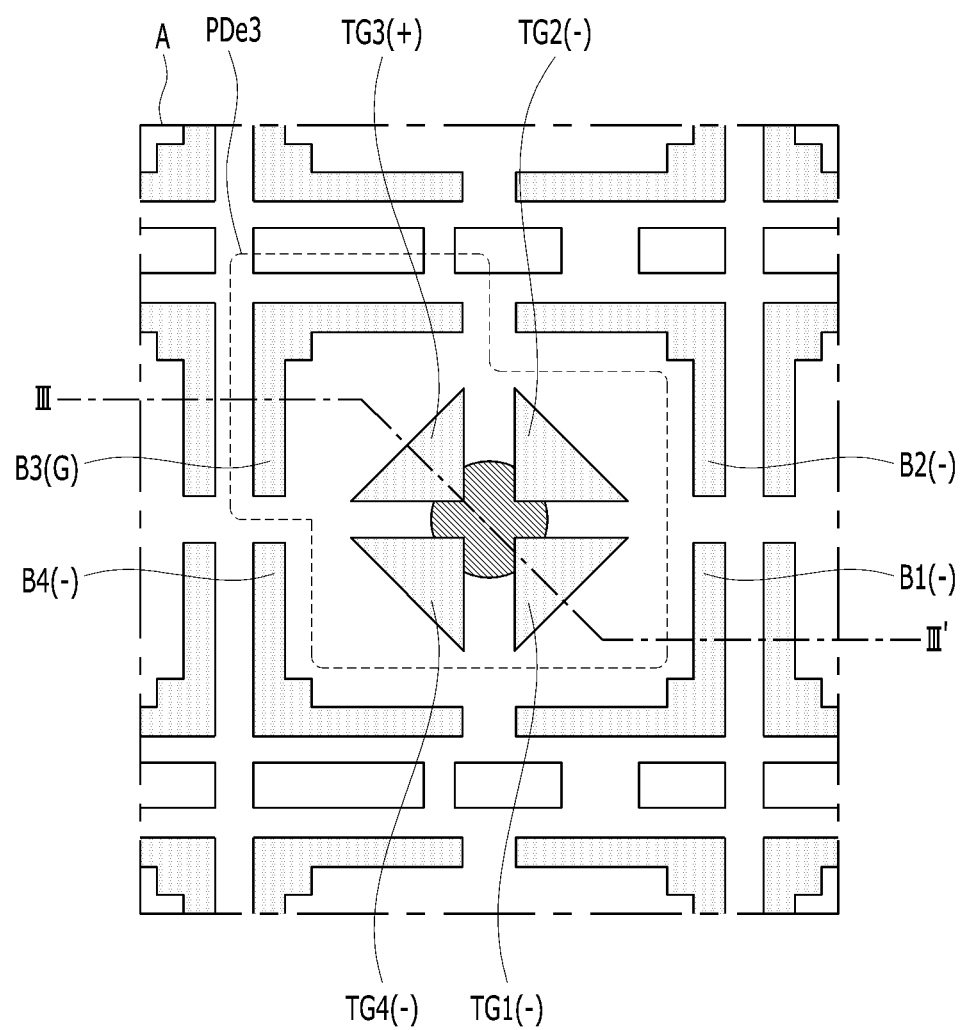

FIG. 5C is a top view illustrating an operation of the unit pixel PX in a third operation cycle of the image sensor in accordance with the embodiment of the disclosed technology. Referring to FIG. 5C, when the third PD bias pattern B3 of the unit pixel PX is grounded (G) and a negative (−) voltage is applied to the first, second, and fourth PD bias patterns B1, B2 and B4 in the third operation cycle, a third effective photodiode region PDe3 may be defined as shown with the dotted line in the drawing. Specifically, since the first, second and fourth PD bias patterns B1, B2, B4 to which the negative (−) voltage is applied may provide a depletion region where there is no electron in the inside of the photodiode region PD, the photodiode region PD in which photoelectrons are generated may be reduced around the first, second, and fourth PD bias patterns B1, B2, B4. The third PD bias pattern B3 which is grounded may enlarge the photodiode region PD in which electrons are generated. In the third operation cycle, the third effective photodiode region PDe3 may include the enlarged periphery of the third PD bias pattern B3 and the reduced peripheries of the first, second, and fourth PD bias patterns B1, B2 and B4, as compared to the photodiode region PD shown in FIGS. 3A and 3B. In the third operation cycle, a positive (+) voltage may be applied to the third transfer gate TG3, and a negative (−) voltage may be applied to the first, second, and fourth transfer gates TG1, TG2 and TG4. Thus, in the third operation cycle, the third transfer gate TG3 may transfer photoelectrons generated in the third effective photodiode region PDe3 to the floating diffusion region FD.

Figure 5D:
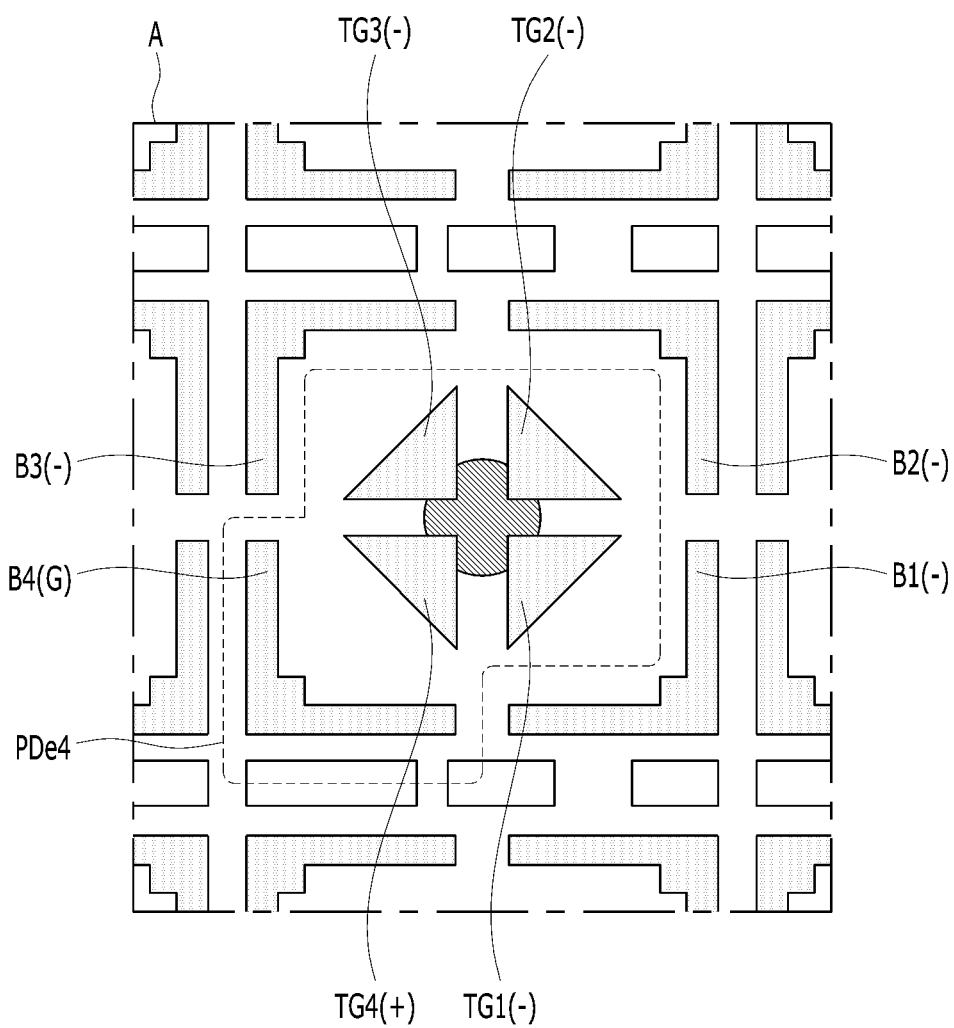

FIG. 5D is a top view illustrating an operation of the unit pixel PX in a fourth operation cycle of the image sensor in accordance with the embodiment of the disclosed technology. Referring to FIG. 5D, when the fourth PD bias pattern B4 of the unit pixel PX is grounded (G) and a negative (−) voltage is applied to the first to third PD bias patterns B1 to B3 in the fourth operation cycle, a fourth effective photodiode region PDe4 may be defined as shown with the dotted line in the drawing. Specifically, since the first to third PD bias patterns B1 to B3 to which the negative (−) voltage is applied may provide a depletion region where there is no electron in the inside of the photodiode region PD, the photodiode region PD in which photoelectrons are generated may be reduced around the first to third PD bias patterns B1 to B3. The fourth PD bias pattern B4 which is grounded may enlarge the photodiode region PD in which electrons are generated. In the fourth operation cycle, the fourth effective photodiode region PDe4 may include the enlarged periphery of the fourth PD bias pattern B4 and the reduced peripheries of the first to third PD bias patterns B1 to B3, as compared to the photodiode region PD shown in FIGS. 3A and 3B. In the fourth operation cycle, a positive (+) voltage may be applied to the fourth transfer gate TG4, and a negative (−) voltage may be applied to the first to third transfer gates TG1 to TG3. Thus, in the fourth operation cycle, the fourth transfer gate TG4 may transfer photoelectrons generated in the fourth effective photodiode region PDe4 to the floating diffusion region FD.

Figure 6A:
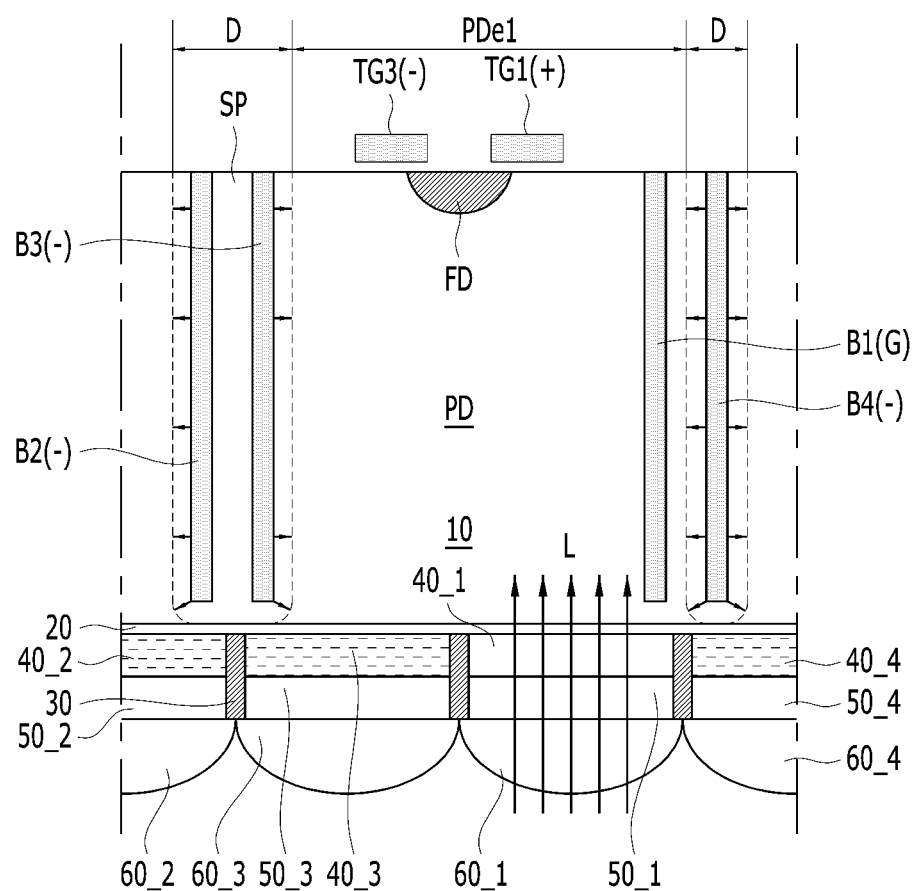
FIG. 6A is a longitudinal cross-sectional view of the unit pixel of the image sensor taken along a line II-II' of FIG. 5A.

FIG. 6A is a longitudinal cross-sectional view of an unit pixel of an image sensor taken along a line II-II' of FIG. 5A. Referring to FIG. 6A, in the first operation cycle, as depletion regions D are generated or formed in the peripheries of the second to fourth PD bias patterns B2 to B4 to which a negative (−) voltage is applied, the first effective photodiode region PDe1 may be defined. In the first operation cycle, the first shutter pattern 40_1 may be opened and the second to fourth shutter patterns 40_2 to 40_4 may be blocked. Therefore, only the light L transmitted through the first micro lens 60_1, the first color filter 50_1 and the first shutter pattern 40_1 may be irradiated into the first effective photodiode region PDe1, and the lights transmitted through the second to fourth micro-lenses 60_2 to 60_4 and the second to fourth color filters 50_2 to 50_4 may not be irradiated into the inside of the first effective photodiode region PDe1. In other words, the first effective photodiode region PDe1 may have only the same color information as the first color filter 50_1. In the first operation cycle, a positive (+) voltage may be applied to the first transfer gate TG1, and a negative (−) voltage may be applied to the second to fourth transfer gates TG2 to TG4. Thus, only the first transfer gate TG1 may be turned on, and thus the photoelectrons in the first effective photodiode region PDe1 may be transferred to the floating diffusion region FD.

Figure 6B:
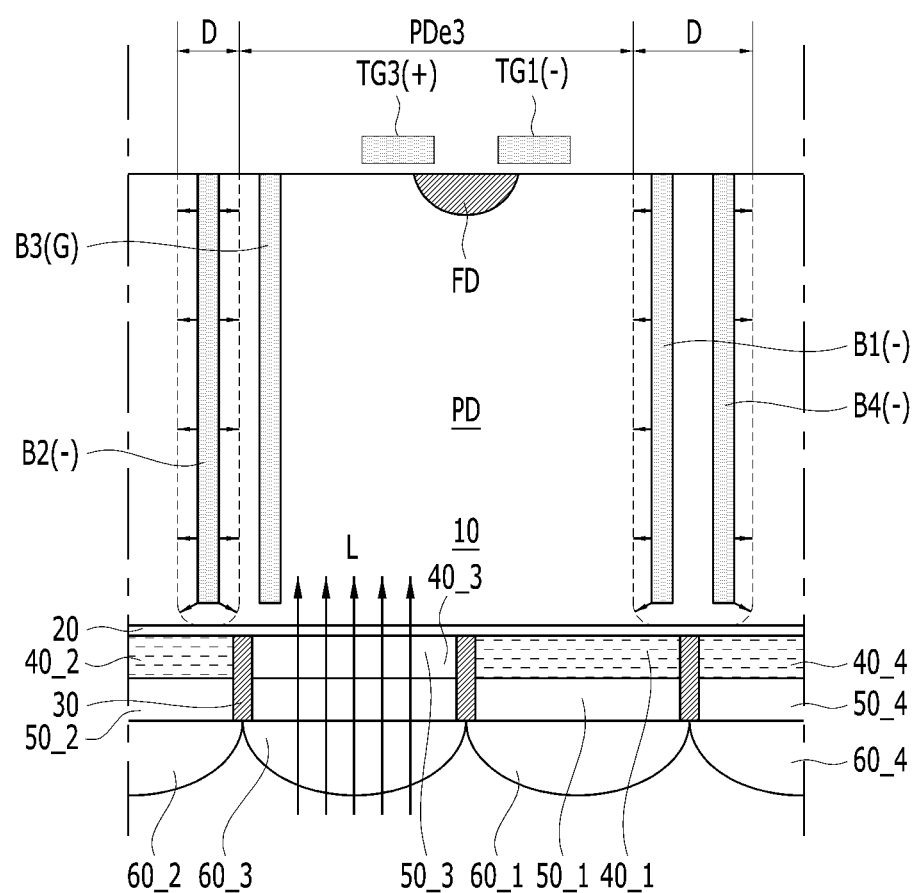
FIG. 6B is a longitudinal cross-sectional view of the unit pixel of the image sensor taken along a line III-III' of FIG. 5C.

FIG. 6B is a longitudinal cross-sectional view of the unit pixel of the image sensor taken along a line III-III' of FIG. 5C. Referring to FIG. 6B, in the third operation cycle, as depletion regions D are generated or formed in the peripheries of the first, second and fourth PD bias patterns B1, B2 and B4 to which a negative (−) voltage is applied, the third effective photodiode region PDe3 may be defined. In the third operation cycle, the third shutter pattern 40_3 may be opened and the first, second and fourth shutter patterns 40_1, 40_2 and 40_4 may be blocked. Therefore, only the light L transmitted through the third micro lens 60_3, the third color filter 50_3 and the third shutter pattern 40_3 may be irradiated into the inside of the third effective photodiode region PDe3, and the lights transmitted through the first, second and fourth micro-lenses 60_1, 60_2 and 60_4 and the first, second and fourth color filters 50_1, 50_2 and 50_4 may not be irradiated into the inside of the third effective photodiode region PDe3. In other words, the third effective photodiode region PDe3 may have only the same color information as the third color filter 50_3. In the third operation cycle, a positive (+) voltage may be applied to the third transfer gate TG3, and a negative (−) voltage may be applied to the first, second and fourth transfer gates TG1, TG2 and TG4. That is, only the third transfer gate TG3 may be turned on, and thus the photoelectrons in the third effective photodiode region PDe3 may be transferred to the floating diffusion region FD.

Figure 7:
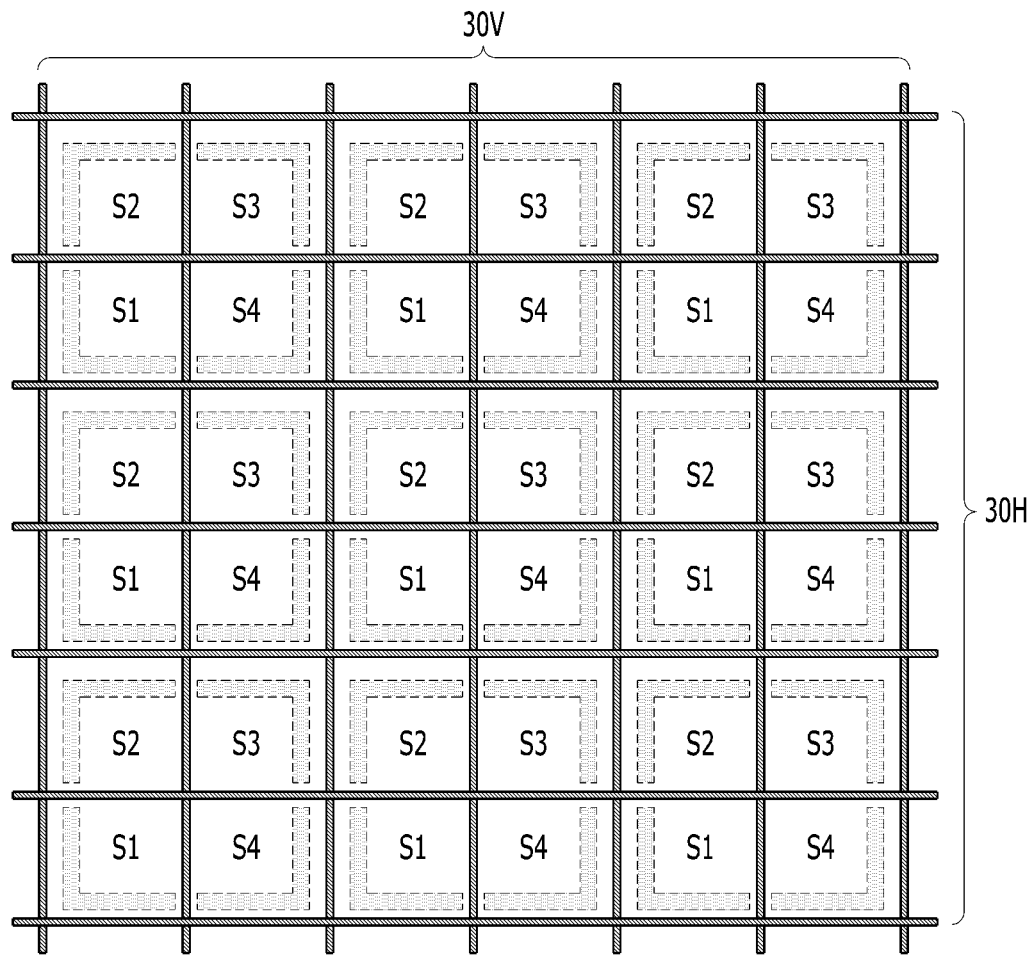
FIG. 7 is an exemplary layout of grid patterns on a lower side of a substrate of an image sensor.

FIG. 7 is a layout of grid patterns on a lower side of a substrate of the image sensor. To facilitate understanding the disclosed technology, the PD bias patterns B1 to B4 are shown together using a dotted line. Referring to FIG. 7, the grid patterns 30 of the image sensor in accordance with the embodiment of the disclosed technology may include vertical grid patterns 30V that extend vertically and spaced apart from one another and horizontal grid patterns 30H that extend horizontally and spaced apart from one another, where the vertical grid patterns 30V and the horizontal grid patterns 30H are orthogonal to each other. The grid patterns 30V and 30H may be disposed on a lower side of the substrate 10 in a mesh form such that each of the vertical gird patterns 30V crosses each of the horizontal grid patterns 30H. The lower side of the substrate 10 is where the shutter patterns 40_1 to 40_4, the color filters 50_1 to 50_4, and the micro-lenses 60_1 to 60_4 are stacked. The first to fourth shutter patterns 40_1 to 40_4 and the first to fourth color filters 50_1 to 50_4 shown in FIGS. 6A and 6B may be stacked in the first to fourth cell spaces S1 to S4 defined by the grid patterns 30V and 30H, and the first to fourth micro-lenses 60_1 to 60_4 may be stacked over the grid patterns 30V and 30H and the first to fourth color filters 50_1 to 50_4. Each of the first to fourth cell spaces S1 to S4 may correspond to one among a red color, a blue color, a first green color, and/or a second green color. The first to fourth spaces S1 to S4 may overlap with the photodiode region PD. In other words, the photodiode region PD may be shared by the first to fourth cell spaces S1 to S4 to receive lights of all colors.

Referring to FIG. 5A, when the first shutter pattern 40_1 is opened and the second to fourth shutter patterns 40_2 to 40_4 are blocked in the first operation cycle, the first effective photodiode region PDe1 may generate photoelectrons having first color information by or from the first color filter 50_1. The photoelectrons having the first color information may be transferred to the floating diffusion region FD by the first transfer gate TG1.

Referring to FIG. 5B, when the second shutter pattern 40_2 is opened and the first, third, and fourth shutter patterns 40_1, 40_3, and 40_4 are blocked in the second operation cycle, the second effective photodiode region PDe2 may generate photoelectrons having second color information by or from the second color filter 50_2. The photoelectrons having the second color information may be transferred to the floating diffusion region FD by the second transfer gate TG2.

Referring to FIG. 5C, when the third shutter pattern 40_3 is opened and the first, second, and fourth shutter patterns 40_1, 40_2, and 40_4 are blocked in the third operation cycle, the third effective photodiode region PDe3 may generate photoelectrons having third color information by or from the third color filter 50_3. The photoelectrons having the third color information may be transferred to the floating diffusion region FD by the third transfer gate TG3.

Referring to FIG. 5D, when the fourth shutter pattern 40_4 is opened and the first to third shutter patterns 40_1 to 40_3 are blocked in the fourth operation cycle, the fourth effective photodiode region PDe4 may generate photoelectrons having fourth color information by or from the fourth color filter 50_4. The photoelectrons with the fourth color information may be transferred to the floating diffusion region FD by the fourth transfer gate TG4.

Figure 8A:
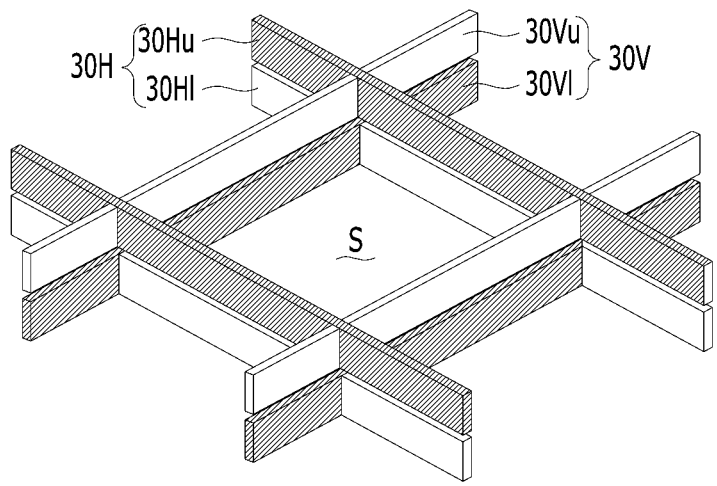
FIGS. 8A and 8B are three-dimensional perspective views of grid patterns.
Figure 8B:
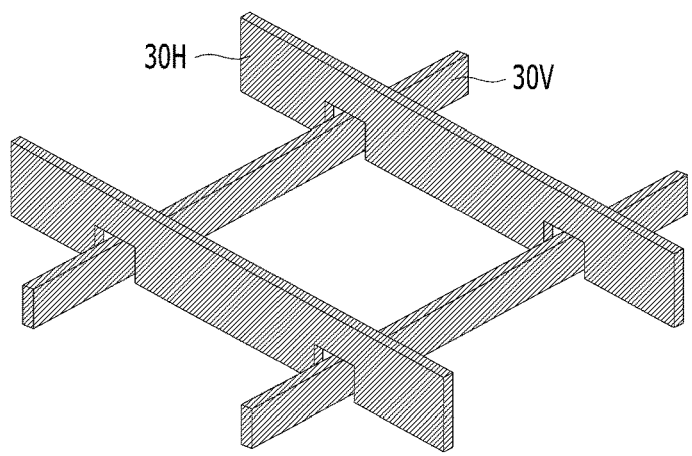

FIGS. 8A and 8B are three-dimensional perspective views of the grid patterns 30V and 30H. Referring to FIG. 8A, the grid patterns 30V and 30H may be formed in two layers. For example, the horizontal grid patterns 30H may include lower horizontal grid patterns 30Hl and upper horizontal grid patterns 30Hu, and the vertical grid patterns 30V may also include lower vertical grid patterns 30Vl and upper vertical grid patterns 30Vu. According to an embodiment of the disclosed technology, the upper horizontal grid patterns 30Hu and the lower vertical grid patterns 30Vl may include a conductor, such as metal, and the lower horizontal grid patterns 30Hl and the upper vertical grid patterns 30Vu may include a non-conductor. In other words, the horizontal grid patterns 30H and the vertical grid patterns 30V may be electrically isolated from each other. Accordingly, the space S may include a lower electric field generated by the lower vertical grid patterns 30Vl that are in parallel and an upper electric field generated by the upper horizontal grid patterns 30Hu that are in parallel. The first to fourth shutter patterns 40_1 to 40_4 of FIGS. 6A and 6B may be opened or blocked by the upper electric field and/or the lower electric field. Specifically, when one among the first to fourth shutter patterns 40_1 to 40_4 is opened, the remaining three among the first to fourth shutter patterns 40_1 to 40_4 may be blocked.

Referring to FIG. 8B, the grid patterns 30V and 30H may include vertical grid patterns 30V which are relatively short in height and horizontal grid patterns 30H which are relatively high in height. The horizontal grid patterns 30H and the vertical grid patterns 30V may be spaced apart from each other to be electrically isolated from each other. The relative positions of the horizontal grid pattern 30H and the vertical grid pattern 30V may be reversed.

Figure 9A:
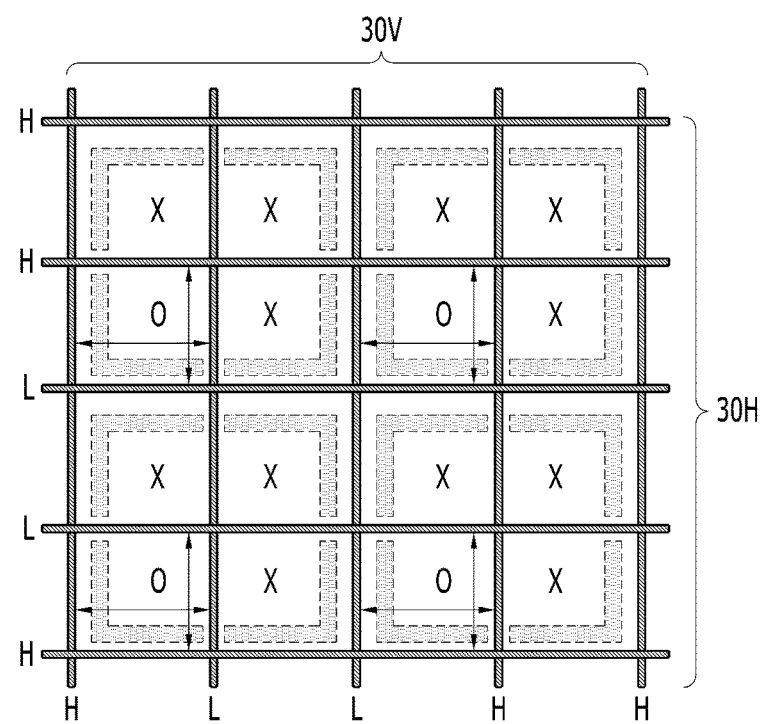
FIGS. 9A to 9D conceptually illustrate voltage conditions for opening or closing first to fourth shutter patterns of an image sensor in accordance with the embodiment of the disclosed technology.
Figure 9B:
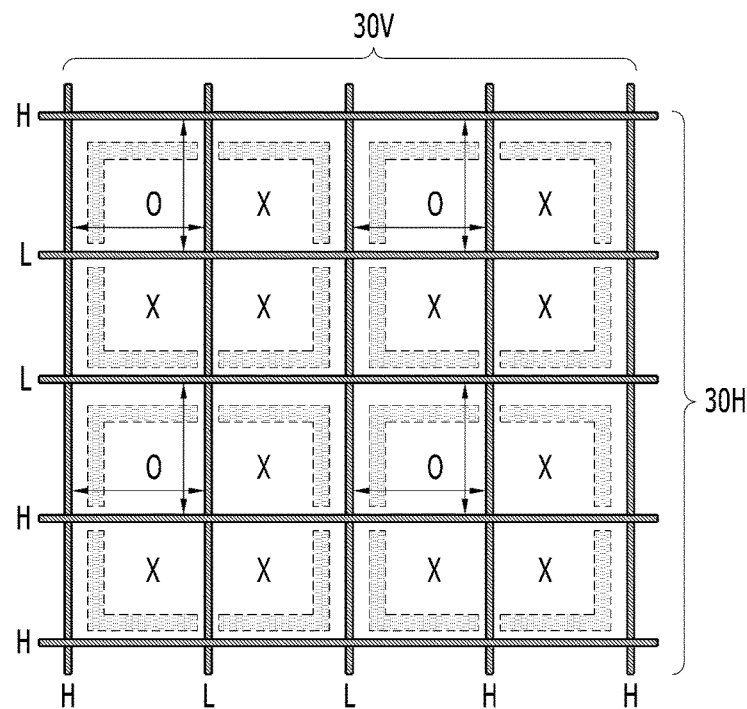
Figure 9C:
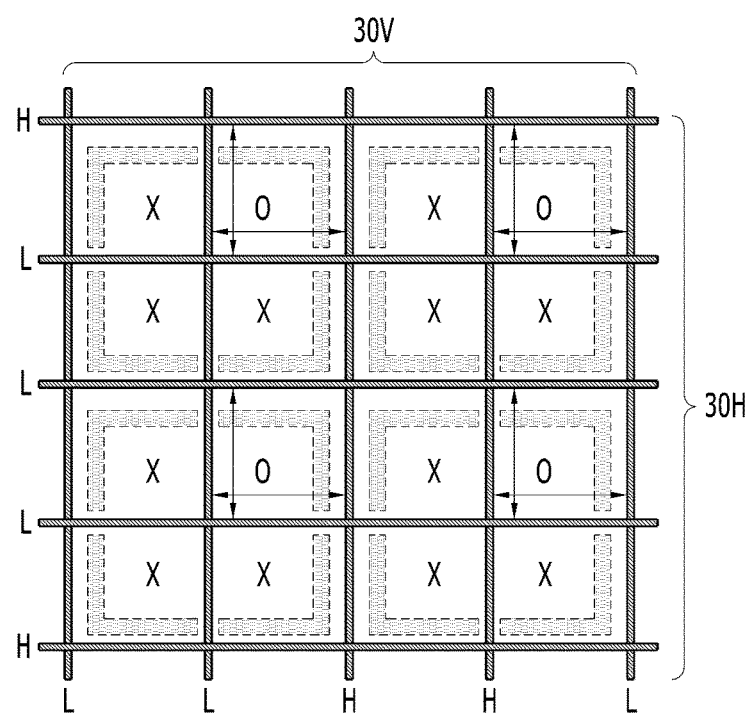
Figure 9D:
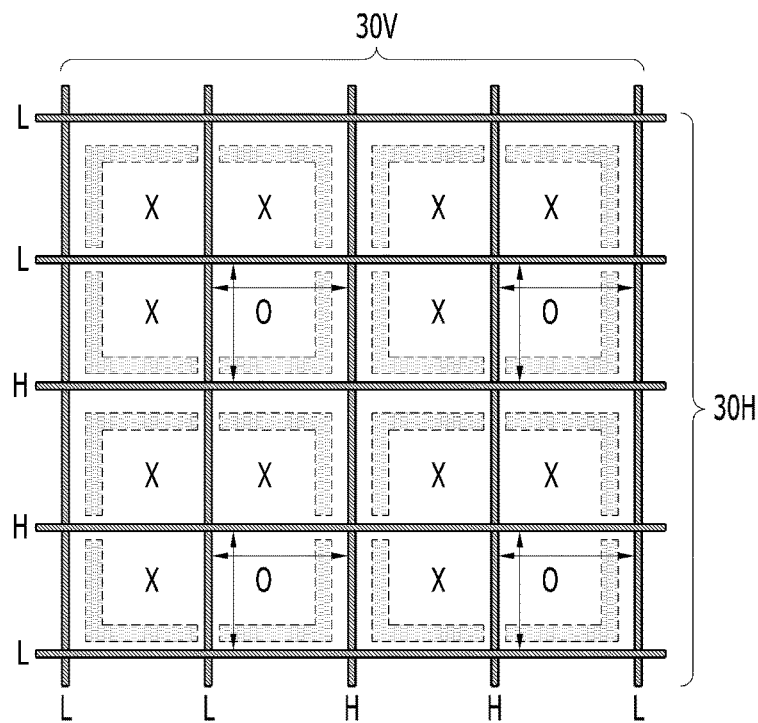

FIGS. 9A to 9D conceptually illustrate voltage conditions for opening or closing the first to fourth shutter patterns of the image sensor in accordance with the embodiment of the disclosed technology. Referring to FIGS. 9A to 9D, when the neighboring horizontal grid patterns 30H have a horizontal potential difference and the neighboring vertical grid patterns 30V have a vertical potential difference, the shutter patterns 40_n disposed between them may be opened (Cell spaces indicated as 'O'). When any one among the neighboring horizontal grid patterns 30H or the neighboring vertical grid patterns 30V does not have a potential difference, the shutter patterns 40_n disposed between them may be blocked (Cell spaces indicated as 'X'). In other words, only when all the neighboring horizontal grid patterns 30H and all the neighboring vertical grid patterns 30V have potential differences, the shutter pattern 40_n may be opened. In FIGS. 9A to 9D, a relatively high potential is indicated as 'H', and a relatively low potential is indicated as 'L'. The 'H' and 'L' may be interchangeable. For example, in FIG. 9A, when the first to fifth horizontal grid patterns are located from the top to the bottom, there exists a horizontal potential difference between the second horizontal grid pattern 30H and the third horizontal grid pattern 30H, and between the fourth horizontal grid pattern 30H and fifth horizontal gird pattern 30H. In the example of FIG. 9A, when the first to fifth vertical grid patterns are located from the left to the right, there exists a vertical potential difference between the first vertical grid pattern 30V and the second vertical grid pattern 30V and between the third vertical grid pattern 30V and the fourth vertical grid pattern 30V. Thus, in FIG. 9A, the shutter patterns disposed in the cell spaces S1 in FIG. 7 are opened. FIG. 9B to 9D also show implementations of the opening/closing of the shutter patterns of the image sensor based on the potential differences of the grid patterns.

Figure 10:
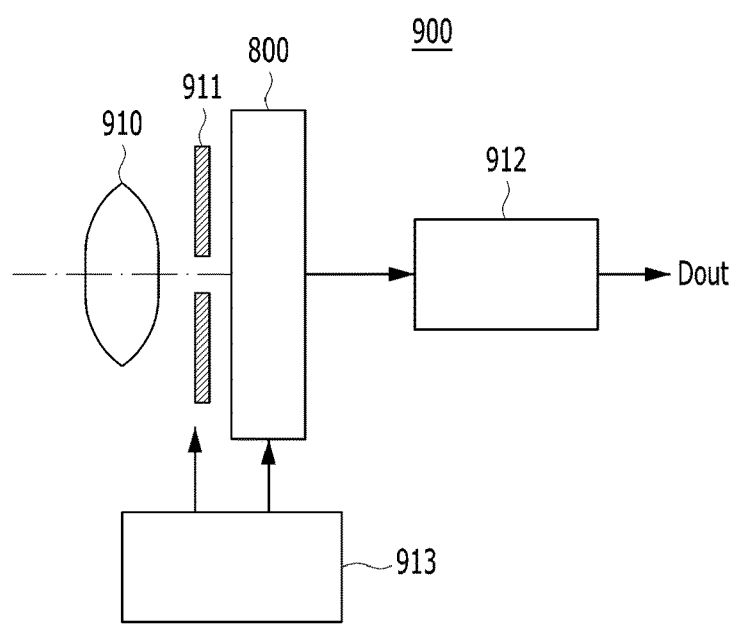
FIG. 10 is a conceptual diagram illustrating an electronic device having an image sensor in accordance with an embodiment of the disclosed technology.

FIG. 10 is a diagram schematically illustrating an electronic device 900 including one of the image sensors based on the various embodiments.

Referring to FIG. 10, the electronic device 900 including at least one of the image sensors based on the embodiments may include a camera capable of photographing a still image or a moving image. The electronic device 900 may include an optical system (or optical lens) 910, a shutter unit 911, a driving unit 913 for controlling/driving an image sensor 800 and the shutter unit 911, and a signal processing unit 912. The image sensor 800 may include one of the image sensors 100A to 100P according to the various embodiments.

The optical system 910 may guide image light (incident light) from an object, to a pixel array (see the reference numeral 810 of FIG. 1) of the image sensor 800. The optical system 910 may include a plurality of optical lenses. The shutter unit 911 may control a light irradiation period and a light shielding period for the image sensor 800. The driving circuit 913 may control the transmission operation of the image sensor 800 and the shutter operation of the shutter unit 911. The signal processing unit 912 performs various kinds of signal processing for the signal outputted from the image sensor 800. An image signal Dout after signal processing may be stored in a storage medium such as a memory or may be outputted to a monitor or the like.

According to the embodiments of the disclosed technology, since the image sensor is configured to receive lights of multiple colors by using only one photodiode region, the light receiving capability and the photoelectron generating capability of the photodiode region may be improved.

According to the embodiments of the disclosed technology, the image sensor is designed to have different effective photodiode regions that can be changed adequately to receive lights of various colors according to the applied voltage.

Other effects of the diverse embodiments of the disclosed technology that are not described herein can be understood from the detailed description of the disclosed technology.

While the disclosed technology has been described with respect to the specific embodiments, it will be apparent to those skilled in the art that various changes and modifications may be made.

What is claimed is:

1. An image sensor, comprising:
   a photosensing region in a substrate and configured to generate photoelectrons in response to incident light on the photosensing region;
   bias patterns arranged to surround the photosensing region and including a conductive material;
   a floating diffusion region at a center of the photosensing region to store photoelectrons generated by the photosensing region; and
   transfer gates that partially overlap with the floating diffusion region and are operable to transfer photoelectrons generated by the photosensing region to the floating diffusion region,
   wherein the photosensing region and the bias patterns are electrically isolated from one another.

2. The image sensor of claim 1,
   wherein the bias patterns include:
   a lining insulating layer which is formed on inner walls of trenches formed in the substrate, and
   a conductor which fills the trenches over the lining insulating layer.

3. The image sensor of claim 1,
   wherein the bias patterns have an elbow shape in a top view, and the bias patterns are radially arrayed over the photosensing region.

4. The image sensor of claim 3,
   wherein the bias patterns have a shape of a partition wall in a longitudinal cross-sectional view.

5. The image sensor of claim 1,
   wherein the photosensing region is surrounded by the bias patterns.

6. The image sensor of claim 1,
   wherein each of the bias patterns extends from a first side of the substrate toward a second, opposite side of the substrate, and
   lower ends of the bias patterns are spaced apart from the second side of the substrate.

7. The image sensor of claim 1, further comprising:
   horizontal grid patterns disposed on the substrate;
   vertical grid patterns disposed on the substrate and arranged to cross the horizontal grid patterns, and
   wherein the horizontal grid patterns and the vertical grid patterns provide cell spaces that overlap with the photosensing region,
   wherein the horizontal grid patterns and the vertical grid patterns are electrically isolated from each other.

8. The image sensor of claim 7, further comprising:
   shutter patterns arranged in the cell spaces, respectively; and color filters disposed over the shutter patterns, respectively, each color filter structured to allow transmission of a selected color while blocking light of other colors.

9. The image sensor of claim 8, wherein the shutter patterns are turned on or off to transmit light only when a corresponding shutter pattern is turned on.

10. The image sensor of claim 1, wherein the bias patterns include pad regions, respectively, the pad regions structured to contacting the bias patterns with a contact plug.

11. An image sensor, comprising:
a substrate;
first to fourth PD bias patterns disposed in the substrate and including a conductive material and providing a photodiode region in the substrate;
a floating diffusion region disposed in an upper portion of the substrate and around a center of the photodiode region; and
first to fourth transfer gates disposed over the substrate to overlap with the photodiode region and the floating diffusion region to cause transfer of photoelectrons generated in the photodiode region to the floating diffusion region,
wherein the first to fourth PD bias patterns are radially arrayed on first to fourth quadrants of the photodiode region and spaced apart from one another.

12. The image sensor of claim 11,
wherein the photodiode region and the first to fourth PD bias patterns are electrically isolated from one another.

13. The image sensor of claim 11,
wherein each of the first to fourth PD bias patterns includes:
a lining insulating layer which is conformally formed on inner walls of trenches formed in the substrate, and
a conductor which fills the trenches over the lining insulating layer.

14. The image sensor of claim 11, further comprising:
grid patterns disposed over an opposite side of the substrate to the first to fourth transfer gates;
first to fourth cell spaces that share the photodiode region,
wherein each of the first to fourth cell spaces is surrounded by the grid patterns.

15. The image sensor of claim 14, further comprising:
first to fourth shutter patterns arranged in the first to fourth cell spaces, respectively; and
first to fourth color filters disposed over the first to fourth shutter patterns, respectively.

16. The image sensor of claim 15,
wherein the first to fourth shutter patterns are turned on or off and configured to transmit light when a corresponding shutter pattern is turned on.

17. The image sensor of claim 15,
wherein when one of the first to fourth shutter pattern is turned on, other three shutter patterns are turned off.

18. The image sensor of claim 14,
wherein the grid patterns include horizontal grid patterns that extend in parallel with respect to one another in a horizontal direction and vertical grid patterns that extend in parallel to one another in a vertical direction, and
the horizontal grid patterns and the vertical grid patterns are electrically isolated from one another.

19. The image sensor of claim 11,
wherein the first to fourth PD bias patterns have an elbow shape in a top view, and have a shape of a partition wall in a longitudinal cross-sectional view.

* * * * *